(12) United States Patent
Fujii et al.

(10) Patent No.: US 7,910,631 B2
(45) Date of Patent: Mar. 22, 2011

(54) PHOTOSENSITIVE RESIN COMPOSITION AND FLEXIBLE PRINTED WIRING CIRCUIT BOARD HAVING INSULATIVE COVER LAYER FORMED OF PHOTOSENSITIVE RESIN COMPOSITION

(75) Inventors: Hirofumi Fujii, Ibaraki (JP); Katsutoshi Hirashima, Ibaraki (JP); Masaki Mizutani, Ibaraki (JP); Kyouyuu Jo, Ibaraki (JP)

(73) Assignee: Nitto Denko Corporation, Ibaraki-shi, Osaka (JP)

( * ) Notice: Subject to any disclaimer, the term of this patent is extended or adjusted under 35 U.S.C. 154(b) by 377 days.

(21) Appl. No.: 12/252,677

(22) Filed: Oct. 16, 2008

(65) Prior Publication Data

US 2009/0101394 A1  Apr. 23, 2009

(30) Foreign Application Priority Data

Oct. 17, 2007  (JP) ................. 2007-270507

(51) Int. Cl.
| | |
|---|---|
| C08F 2/50 | (2006.01) |
| C08J 3/28 | (2006.01) |
| C09K 21/12 | (2006.01) |
| C09K 21/14 | (2006.01) |
| C09K 21/06 | (2006.01) |
| C09K 21/00 | (2006.01) |
| G03C 1/06 | (2006.01) |

(52) U.S. Cl. ........ 522/171; 522/100; 522/101; 522/102; 522/103; 522/113; 522/114; 522/120; 522/121; 522/122; 522/134; 522/150; 522/153; 522/162; 522/166; 522/168; 522/142; 522/143; 522/144; 522/170; 522/178; 522/181; 522/182; 430/280.1; 252/601; 528/44; 528/72; 523/300

(58) Field of Classification Search ............... 522/142, 522/143, 144, 100, 101, 103, 102, 113, 114, 522/120, 121, 122, 134, 150, 153, 162, 166, 522/168, 170, 171, 178, 181, 182; 430/280.1, 430/281.1, 285.1, 286.1, 287.1, 288.1, 311, 430/315; 252/601, 604, 609; 528/44, 72; 523/300, 451, 452, 438, 439, 413, 414

See application file for complete search history.

(56) References Cited

U.S. PATENT DOCUMENTS

| | | | |
|---|---|---|---|
| 6,528,559 B1 * | 3/2003 | Nakacho et al. | 524/116 |
| 6,596,893 B2 * | 7/2003 | Nakacho et al. | 558/157 |
| 6,905,768 B2 * | 6/2005 | Tada et al. | 428/413 |
| 7,049,036 B1 * | 5/2006 | Satou et al. | 430/17 |
| 7,122,587 B2 * | 10/2006 | Shimoda et al. | 523/452 |
| 2008/0063955 A1 * | 3/2008 | Fujii et al. | 430/18 |
| 2008/0241759 A1 * | 10/2008 | Mizutani et al. | 430/315 |

FOREIGN PATENT DOCUMENTS

| | | |
|---|---|---|
| JP | 11-166035 B2 | 6/1999 |
| JP | 11-279258 B2 | 10/1999 |
| JP | 2006-235371 A | 9/2006 |

* cited by examiner

Primary Examiner — Sanza L McClendon

(74) Attorney, Agent, or Firm — Westerman, Hattori, Daniels & Adrian, LLP

(57) ABSTRACT

A photosensitive resin composition which is excellent in flame resistance, resolution and flexibility, and substantially free from deposition of components thereof to prevent contamination of a product. The photosensitive resin composition comprises:

(A) a cyclic phosphazene compound represented by the following general formula (1):

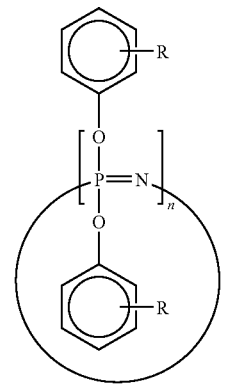

(1)

wherein at least one of the Rs is an organic group having the urethane(meth)acrylate structure represented by the following general formula (2) and n is a positive number of 2 to 5:

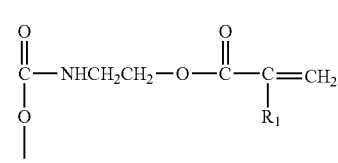

(2)

wherein $R_1$ is a hydrogen atom or a methyl group;

(B) a carboxyl-containing linear polymer obtained by polymerizing an ethylenically unsaturated compound through addition polymerization;
(C) an epoxy resin;
(D) an ethylenically unsaturated group-containing polymerizable compound; and
(E) a photopolymerization initiator;
wherein the cyclic phosphazene compound (A) is present in a proportion of 5 to 30 wt % based on the total weight of the composition.

6 Claims, No Drawings

PHOTOSENSITIVE RESIN COMPOSITION AND FLEXIBLE PRINTED WIRING CIRCUIT BOARD HAVING INSULATIVE COVER LAYER FORMED OF PHOTOSENSITIVE RESIN COMPOSITION

BACKGROUND OF THE INVENTION

1. Field of the Invention

The present invention relates to a photosensitive resin composition, and to a flexible printed wiring circuit board having an insulative cover layer formed of the photosensitive resin composition.

2. Description of the Related Art

An electrically conductive pattern of a flexible printed wiring circuit board on which an electronic component such as a semiconductor device is mounted by soldering is generally covered with an insulative cover layer formed, for example, by applying a heat resistant material such as a solder resist on the electrically conductive pattern by a screen printing method or an exposure/development method.

Typically usable as the solder resist is a photosensitive resin composition, for example, containing a carboxyl-containing linear polymer, a photopolymerizable monomer, a cyclic phosphazene compound (flame retarder), a pigment and the like (see, for example, JP-A-2006-235371).

When the flexible printed wiring circuit board having the insulative cover layer formed of the aforementioned solder resist (photosensitive resin composition) is allowed to stand under high temperature and high humidity conditions, components of the solder resist are liable to be deposited on the wiring circuit board to contaminate a product which incorporates the circuit board. Particularly, the cyclic phosphazene compound flame retarder is most liable to be deposited on the wiring circuit board. Therefore, it is desired to prevent the deposition of the cyclic phosphazene compound as well as to improve the flame resistance, the flexibility and the resolution of the solder resist.

In view of the foregoing, it is an object of the present invention to provide a photosensitive resin composition which is excellent in flame resistance, resolution, warp resistance and flexibility when used for a flexible printed wiring circuit board, and is substantially free from deposition of components thereof to prevent contamination of a product incorporating the flexible printed wiring circuit board, and to provide a flexible printed wiring circuit board having an insulative cover layer formed of the photosensitive resin composition.

SUMMARY OF THE INVENTION

According to a first aspect of the present invention to achieve the aforementioned object, there is provided a photosensitive resin composition comprising;

(A) a cyclic phosphazene compound represented by the following general formula (1):

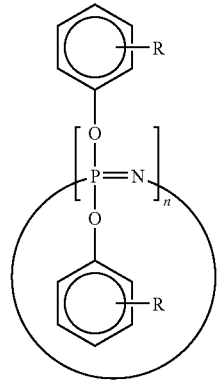

wherein each R may be the same or different and each R is a hydrogen atom, a hydroxyl group or an organic group having a urethane(meth)acrylate structure represented by the following general formula (2), at least one of the Rs being the organic group having the urethane(meth)acrylate structure, and n is a positive number of 2 to 5, representing an average polymerization degree:

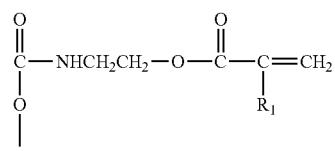

wherein $R_1$ is a hydrogen atom or a methyl group;

(B) a carboxyl-containing linear polymer obtained by polymerizing an ethylenically unsaturated compound through addition polymerization (hereinafter referred to simply as "specific carboxyl-containing linear polymer");
(C) an epoxy resin;
(D) an ethylenically unsaturated group-containing polymerizable compound; and
(E) a photopolymerization initiator;
 wherein the cyclic phosphazene compound (A) is present in a proportion of 5' to 30 wt % based on the total weight of the composition.

According to a second aspect of the present invention, there is provided a flexible printed wiring circuit board having an electrically conductive circuit pattern covered with an insulative cover layer formed by forming a layer of the photosensitive resin composition according to the first inventive aspect, and exposing and developing the photosensitive resin composition layer into a predetermined pattern.

The inventors of the present invention conducted a series of studies to provide a photosensitive resin composition as a photosensitive resist material which is excellent in flame resistance, resolution and flexibility and substantially free from deposition of the components thereof under high temperature and high humidity conditions. As a result, the inventors found that the photosensitive resin composition which contains the cyclic phosphazene compound (A) (flame retarder) having the aforementioned specific structure in the specific proportion, as well as the specific carboxyl-containing linear polymer (B), the epoxy resin (C) and the ethylenically unsaturated group-containing polymerizable compound (D) is excellent in flame resistance, resolution and flexibility and is substantially free from the deposition of the components thereof, particularly the deposition of the cyclic phosphazene compound, under the high temperature and high humidity conditions. Thus, the inventors attained the present invention.

As described above, the photosensitive resin composition according to the present invention contains the cyclic phosphazene compound (A) (flame retarder) represented by the above general formula (1) as well as the specific carboxyl-containing linear polymer (B), the epoxy resin (C) and the ethylenically unsaturated group-containing polymerizable compound (D), and the cyclic phosphazene compound (A) is present in the specific proportion in the photosensitive resin composition. Therefore, the photosensitive resin composition has flame resistance, resolution and flexibility which are comparable to those of the prior-art photosensitive resin composition and, when a film formed by curing the photosensitive resin composition is stored or allowed to stand under the high temperature and high humidity conditions, the film is substantially free from deposition of the components of the resin composition.

Further, a mount board is produced by mounting electronic components on the flexible printed wiring circuit board formed with the insulative cover layer of the inventive photosensitive resin composition, and is used, for example, for a smaller size device such as a mobile phone.

The epoxy resin (C) is preferably an epoxy resin having a phenyl phosphate skeleton represented by the following general formula (4):

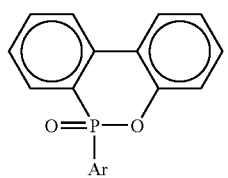

(4)

wherein Ar is an aromatic group. In this case, the flame resistance of the photosensitive resin composition is improved synergistically by the cyclic phosphazene compound (A) and the epoxy resin (C) without reduction in moisture resistance.

The ethylenically unsaturated group-containing polymerizable compound (D) preferably comprises a bisphenol-A di(meth)acrylate compound represented by the following general formula (5):

wherein $R_3$ and $R_4$, which may be the same or different, are each a hydrogen atom or a methyl group, $Y_1$ and $Y_2$ are each a $C_2$ to $C_6$ alkylene group, and p and q are positive integers, which satisfy a relationship of p+q=4 to 40. In this case, the photosensitive resin composition is excellent in photosensitivity and developability when the insulative cover layer is formed on the flexible printed wiring circuit board.

The specific carboxyl-containing linear polymer (B) preferably contains structural units represented by the following general formula (3):

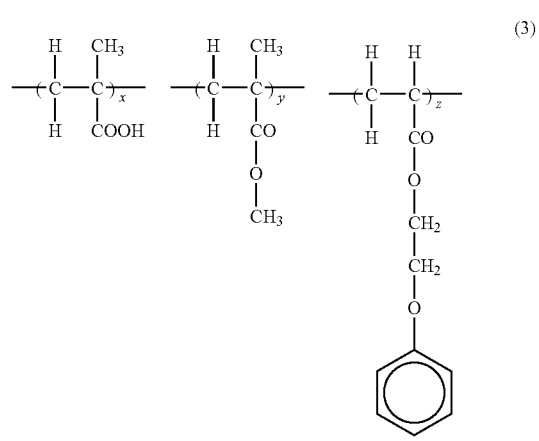

(3)

wherein x, y and z are positive numbers. In this case, the flexible printed wiring circuit board is imparted with excellent flexibility and warp resistance.

In the photosensitive resin composition, the specific carboxyl-containing linear polymer (B) is preferably present in a proportion of 20 to 60 wt % based on the total weight of the composition. In this case, the photosensitive resin composition is excellent in alkali developability and adhesion.

DETAILED DESCRIPTION OF PREFERRED EMBODIMENTS

An inventive photosensitive resin composition is prepared by using a specific cyclic phosphazene compound (A), a specific carboxyl-containing linear polymer (B), an epoxy resin (C), an ethylenically unsaturated group-containing polymerizable compound (D), and a photopolymerization initiator (E).

The cyclic phosphazene compound (A) has a structure represented by the following general formula (1):

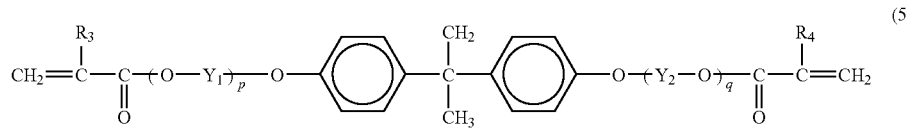

(5)

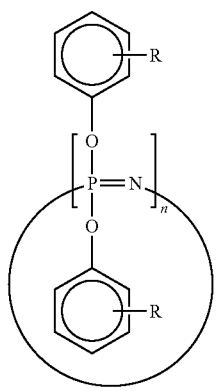

(1)

wherein each R may be the same or different and each R is a hydrogen atom, a hydroxyl group or an organic group having a urethane(meth)acrylate structure represented by the following general formula (2), at least one of the Rs being the organic group having the urethane(meth)acrylate structure, and n is a positive number of 2 to 5, representing an average polymerization degree:

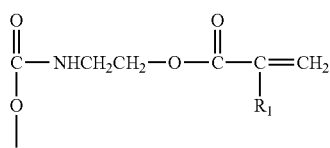

(2)

wherein $R_1$ is a hydrogen atom or a methyl group.

It is particularly preferred that the Rs in the formula (1) are both organic groups each having the urethane(meth)acrylate structure represented by the general formula (2).

The specific cyclic phosphazene compound (A) may be prepared, for example, in the following manner. Hydroquinone is added to a cyclic phenoxyphosphazene compound and heated to be dissolved in the cyclic phenoxyphosphazene compound. Then, (meth)acryloyloxyethyl isocyanate is added to the resulting mixture and, as required, a catalyst is added for reaction. Thus, the cyclic phosphazene compound (A) is prepared.

An example of the specific carboxyl-containing linear polymer (B) to be used together with the component (A) is a polymer obtained by copolymerizing (meth)acrylic acid with other type of ethylenically unsaturated monomer. Since the monomers for the linear polymer can be selected from various types of material monomers, the glass transition temperature (Tg) and other physical properties of the linear polymer can be easily designed.

Examples of the other type of ethylenically unsaturated monomer include alkyl(meth)acrylates such as methyl(meth)acrylate, ethyl(meth)acrylate, butyl(meth)acrylate and 2-ethylhexyl(meth)acrylate, tetrahydrofurfuryl(meth)acrylate, dimethylaminoethyl(meth)acrylate, diethylaminoethyl(meth)acrylate, styrene, α-styrene, vinyltoluene, N-vinylpyrrolidone, 2-hydroxyethyl(meth)acrylate, acrylamide, acrylonitrile, methacrylonitrile, N-phenylmaleimide and cyclohexylmaleimide, which may be used either alone or in combination.

The specific carboxyl-containing linear polymer (B) preferably has a weight average molecular weight of 3000 to 50000, more preferably 4000 to 40000, further more preferably 5000 to 30000. If the weight average molecular weight is less than 3000, the resulting photosensitive resin composition tends to have poorer soldering resistance. If the weight average molecular weight is greater than 50000, the resulting photosensitive resin composition tends to have poorer alkali developability. The weight average molecular weight is determined, for example, by gel permeation chromatography (GPC) based on polystyrene calibration standards.

The specific carboxyl-containing linear polymer (B) preferably has an acid equivalent of 200 to 900, more preferably 250 to 850, further more preferably 300 to 800. An acid equivalent less than 200 is not preferred because oxidation of copper is promoted under high temperature and high humidity conditions. If the acid equivalent is greater than 900, the resulting photosensitive resin composition tends to have poorer alkali developability.

More specifically, it is preferred that the specific carboxyl-containing linear polymer has structural units represented by the following general formula (3):

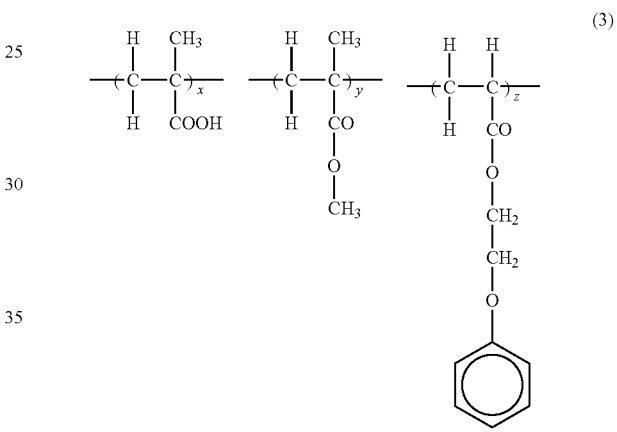

(3)

In the general formula (3), x, y and z represent weight ratios of respective monomers for random copolymerization, and 0.1 to 0.3, 0 to 0.9 and 0 to 0.6, respectively.

The carboxyl-containing linear polymer having the structural units represented by the general formula (3) is prepared, for example, by copolymerizing monomers respectively having the structural units represented by the general formula (3) in their major skeletal structures, (meth)acrylic acid and the aforementioned other type of ethylenically unsaturated monomer.

In the photosensitive resin composition, the carboxyl-containing linear polymer (B) having the structural units represented by the above general formula (3) is preferably present in a proportion of 20 to 60 wt %, more preferably 30 to 50 wt %, based on the total weight of the photosensitive resin composition. Where the proportion of the carboxyl-containing linear polymer (B) is in the range of 20 to 60 wt % based on the total weight of the photosensitive resin composition, the photosensitive resin composition is excellent in developability.

The amount of (meth)acrylic acid as the comonomer is preferably 10 to 30 wt %, more preferably 15 to 25 wt %, based on the total amount of the copolymers. If the amount of (meth)acrylic acid is less than the lower limit, the working efficiency tends to be reduced with a prolonged development period. If the amount of (meth)acrylic acid is greater than the upper limit, the oxidation of copper tends to be promoted under the high temperature and high humidity conditions.

The epoxy resin (C) to be used together with the components (A) and (B) is not particularly limited, but an epoxy resin having a phenyl phosphate skeleton represented by the following general formula (4) is preferably used as the epoxy resin (C):

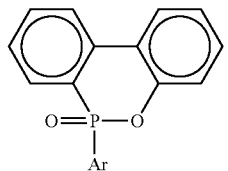

(4)

wherein Ar is an aromatic group.

A specific example of the epoxy resin (C) is a phosphorus-containing epoxy resin which contains an epoxy resin component containing not less than 20 wt % of a novolak epoxy resin, and 1 to 5 wt % of phosphorus derived from the phenyl phosphate skeleton represented by the above general formula (4). Where the proportion of the phosphorus is within the aforementioned range, the phosphorus-containing epoxy resin has sufficient solubility, and the flame resistance of the photosensitive resin composition is further improved synergistically by the specific cyclic phosphazene compound (A) and the phosphorus-containing epoxy resin.

Production methods for the phosphorus-containing epoxy resin are disclosed, for example, in Japanese Patent Nos. 3613724 and 3533973.

The epoxy resin component is not limited to the novolak epoxy resin, but may be any of curable epoxy resins. Other examples of the epoxy resin component include bisphenol epoxy resins, biphenyl epoxy resins, fluorene epoxy resins, resorcinol epoxy resins and polyglycol epoxy resins, which may be used either alone or in combination.

The ethylenically unsaturated group-containing polymerizable compound (O) to be used together with the components (A) to (C) is not particularly limited, but a bisphenol-A di(meth)acrylate compound represented by the following general formula (5) is preferably used because it ensures excellent property balance among soldering resistance, bending resistance and alkali developability:

methylene group is bonded to oxygen and such that the methylene group is not bonded to oxygen. In the formula (5), these two bonding orientations may be present either alone or in combination.

Where two or more —(O—$Y_1$)— repeating units and two or more —($Y_2$—O)— repeating units are present in the formula (5), two or more $Y_1$ groups and two or more $Y_2$ groups may be the same or different from each other. Where two or more types of alkylene groups are present as $Y_1$ and $Y_2$, two or more types of —(O—$Y_1$)— repeating units and two or more types of —($Y_2$—O)— repeating units may be present at random or in a block form.

In the general formula (5), two benzene rings may be each substituted with one or more substituents at substitutable sites thereof. Where the benzene rings each have two or more substituents, the substituents may be the same or different from each other. Examples of the substituents include $C_1$ to $C_{20}$ alkyl groups, $C_3$ to $C_{10}$ cycloalkyl groups, $C_6$ to $C_{14}$ aryl groups, an amino group, a nitro group, a cyano group, a mercapto group, an allyl group, $C_1$ to $C_{10}$ alkylmercapto groups, $C_1$ to $C_{20}$ hydroxyalkyl groups, carboxyalkyl groups having $C_1$ to $C_{10}$ alkyl groups, acyl groups having $C_1$ to $C_{10}$ alkyl groups, and $C_1$ to $C_{20}$ alkoxy groups and heterocyclic groups.

In the general formula (5), the repeating numbers p, q are positive integers, which satisfy a relationship of p+q=4 to 40, more preferably p+q=4 to 15, particularly preferably p+q=5 to 13. If the sum of the repeating numbers p, q is less than 4, the resulting photosensitive resin composition tends to be poorer in bending resistance. If the sum of the repeating numbers p, q is greater than 40, the resulting photosensitive resin composition tends to be more hydrophilic, resulting in poorer insulation reliability under the high temperature and high humidity conditions.

Specific examples of the bisphenol-A di(meth)acrylate compound represented by the general formula (5) include 2,2'-bis[4-(meth)acryloxydiethoxyphenyl]propane, 2,2'-bis[4-(meth)acryloxytetraethoxyphenyl]propane, 2,2'-bis[4-(meth)acryloxypentaethoxyphenyl]propane, 2,2'-bis[4-(meth)acryloxydiethoxyoctapropoxyphenyl]propane, and 2,2'-bis[4-(meth)acryloxytriethoxyoctapropoxyphenyl]propane, which may be used either alone or in combination.

Examples of the photopolymerization initiator (E) to be used together with the components (A) to (D) include substituted or unsubstituted polynuclear quinones (2-ethylan-

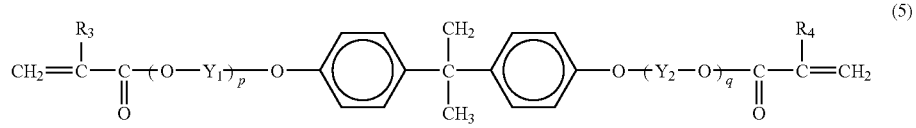

(5)

wherein $R_3$ and $R_4$, which may be the same or different, are each a hydrogen atom or a methyl group, $Y_1$ and $Y_2$ are each a $C_2$ to $C_6$ alkylene group, and p and q are positive integers, which satisfy a relationship of p+q=4 to 40.

Preferred examples of the $C_2$ to $C_6$ alkylene group in the formula (5) include an ethylene group, a propylene group, an isopropylene group, a butylene group, an isobutylene group, a pentylene group, a neopentylene group and a hexylene group, among which the ethylene group is preferred.

The isopropylene group is represented by —CH(CH$_3$)CH$_2$—. Two possible bonding orientations of the isopropylene group in the —(O—$Y_1$)— group and the —($Y_2$—O)— group in the above general formula (5) are such that the thraquinone, 2-t-butylanthraquinone, octamethylanthraquinone, 1,2-benzanthraquinone, 2,3-diphenylanthraquinone and the like), α-ketaldonyl alcohols (benzoin, pivalone and the like), ethers, α-hydrocarbon-substituted aromatic acyloins (α-phenylbenzoin, α,α-diethoxyacetophenone and the like), aromatic ketones (benzophenone and 4,4'-bisdialkylaminobenzophenones such as N,N'-tetraethyl-4,4'-diaminobenzophenone, and the like), thioxanthones (2-methylthioxanthone, 2,4-diethylthioxanthone, 2-chlorothioxanthone, 2-isopropylthioxanthone, 2-ethylthioxanthone and the like), and 2-methyl-1-[4-(methylthio)phenyl]-morpholinopropan-1-one, which may be used either alone or in combination.

The proportions of the components (A) to (E) in the inventive photosensitive resin composition are preferably as follows. First, the proportion of the component (A) should be in the range of 5 to 30 wt %, more preferably 10 to 20 wt %, based on the total weight of the photosensitive resin composition. If the proportion of the component (A) is less than the lower limit value, the resulting photosensitive resin composition is liable to have insufficient flame resistance, and suffer from the deposition of the components under the high temperature and high humidity conditions. If the proportion of the component (A) is greater than the upper limit value, a flexible printed wiring circuit board product obtained by utilizing the resulting photosensitive resin composition is liable to suffer from significant warp.

As described above, the proportion of the component (B) is preferably in the range of 20 to 60 wt %, more preferably 30 to 50 wt %, based on the total weight of the photosensitive resin composition. If the proportion of the component (B) is less than the lower limit value, the resulting photosensitive resin composition tends to have insufficient alkali developability. If the proportion of the component (B) is greater than the upper limit value, the resulting resin composition tends to have poorer adhesiveness.

The proportion of the component (C) is preferably in the range of 1 to 40 wt %, more preferably 10 to 20 wt %, based on the total weight of the photosensitive resin composition. If the proportion of the component (C) is less than the lower limit value, the resulting photosensitive resin composition tends to have insufficient soldering resistance. If the proportion of the component (C) is greater than the upper limit value, the resulting photosensitive resin composition tends to have poorer alkali developability.

The proportion of the component (D) is preferably in the range of 5 to 50 wt %, more preferably 10 to 30 wt %, based on the total weight of the photosensitive resin composition. If the proportion of the component (D) is less than the lower limit value, the resulting photosensitive resin composition tends to have insufficient photosensitivity. If the proportion of the component (D) is greater than the upper limit value, the resulting photosensitive resin composition tends to have lower resolution.

The proportion of the component (E) is preferably in the range of 0.5 to 10 wt %, more preferably 2 to 8 wt %, based on the total weight of the photosensitive resin composition. If the proportion of the component (E) is less than the lower limit value, the resulting photosensitive resin composition tends to have insufficient photosensitivity. If the proportion of the component (E) is greater than the upper limit value, the resulting photosensitive resin composition tends to have poorer physical properties.

As required, pigments such as phthalocyanine green and phthalocyanine blue, fillers such as silica, barium sulfate and talc, defoaming agents, leveling agents, flame retarders, stabilizing agents, tackifiers such as 2-amino-5-mercapto-1,3,4-thiodiazole and 5-amino-1-H-tetrazole, antirust agents such as benzotriazole, thermal crosslinking agents such as epoxy resin block isocyanates, epoxy resin curing catalysts such as basic organic compounds, and other additives may be blended with the aforementioned essential components of the inventive photosensitive resin composition. These additives may be used either alone or in combination. The total amount of any of these additives present in the photosensitive resin composition is preferably in the range of 0.01 to 20 wt % based on the total weight of the photosensitive resin composition.

The inventive photosensitive resin composition is prepared by blending and mixing the aforementioned components in the aforementioned proportions. As required, the photosensitive resin composition is mixed with an organic solvent for use as a photosensitive resin composition solution. The organic solvent is not particularly limited, but examples of the organic solvent include diethylene glycol monoethyl ether acetate, diethylene glycol monobutyl ether acetate, diethylene glycol monoethyl ether, diethylene glycol monomethyl ether, trimethylol propane triacrylate, solvent naphtha, N-methylpyrrolidone, γ-butyrolactone, butyl Cellosolve, ethyl Cellosolve, methyl Cellosolve, toluene, xylene, mesitylene, acetone, methyl ethyl ketone, methyl isobutyl ketone, and solvent mixtures of any of these solvents.

The amount of the solvent to be mixed with the photosensitive resin composition is not particularly limited, but is preferably about 0 to 200 parts by weight per 100 parts by weight of the photosensitive resin composition.

The inventive photosensitive resin composition is useful as a solder resist (a material for an insulative cover layer), for example, for a wiring circuit board such as a flexible printed wiring circuit board. Further, the inventive photosensitive resin composition may be used as a paint, a coating material and an adhesive.

Where the inventive photosensitive resin composition is used as the material for the insulative cover layer for the wiring circuit board, the formation of the insulative cover layer is achieved, for example, in the following manner. An exemplary process for forming the insulative cover layer on the flexible printed wiring circuit board will hereinafter be described.

A coating film is first formed on a surface of the flexible printed wiring circuit board formed with an electrically conductive circuit pattern so as to have a dry thickness of 3 to 50 μm by applying the inventive photosensitive resin composition by a screen printing method, a spray method, a roll coating method or an electrostatic coating method and drying the applied composition at 50 to 120° C. for about 3 to about 60 minutes. Then, a negative or positive pattern mask film is brought into direct contact or indirect contact with the coating film, which is in turn irradiated with activation radiation via the mask.

A light source for the activation radiation may be any of various known light sources. Examples of the light sources include a carbon arc lamp, a mercury vapor arc lamp, an ultra high pressure mercury lamp, a high pressure mercury lamp and a xenon lamp which are effective for emitting ultraviolet radiation, and a photoflood lamp and a solar lamp which are effective for emitting visible light.

Subsequently, the coating film is developed for removal of an unexposed portion of the coating film with the use of a developing agent such as an alkali aqueous solution by a known method such as a spray method, an oscillatory immersion method, a brushing method or a scraping method. Thus, a resist pattern is formed.

Examples of the alkali aqueous solution to be used for the development include a 0.1 to 5 wt % dilute solution of sodium carbonate, a 0.1 to 5 wt % dilute solution of potassium carbonate, a 0.1 to 5 wt % dilute solution of sodium hydroxide and a 0.1 to 5 wt % dilute solution of sodium tetraborate.

After the development, the resulting resist pattern is irradiated with ultraviolet radiation emitted from the high pressure mercury lamp, and/or heated as required for improvement of the soldering resistance and the chemical resistance. The irradiation with the ultraviolet radiation may precede or follow the heating, or the resist pattern may be subjected to only the irradiation with the ultraviolet radiation or the heating.

Thus, the flexible printed wiring circuit board is provided as having the insulative cover layer formed on the electrically conductive circuit pattern. Thereafter, electronic components such as an LSI, a diode, a transistor and a capacitor are mounted on the flexible printed wiring circuit board by soldering. Then, the resulting mount board is mounted in a smaller size device such as a mobile phone.

EXAMPLES

Examples of the present invention will hereinafter be described in conjunction with comparative examples. It should be understood that the invention is not limited to these examples.

Cyclic phosphazene compounds a1, a2 and a carboxyl-containing linear polymer were synthesized as follows.

Synthesis of Cyclic Phosphazene Compound a1

First, 0.0050 g of hydroquinone was added to 20.0 g of a cyclic phenoxyphosphazene compound (SPH-100 available from Otsuka Chemical Co., Ltd.) and heated to 90° C. to be dissolved in the cyclic phenoxyphosphazene compound. Then, 13.7 g of 2-acryloyloxyethyl isocyanate and 0.54 g of a 5% acetic acid solution of dibutyltin laurate were added to the resulting mixture, and allowed to react with the mixture for ten hours in a stream of nitrogen. After completion of the reaction, a molecular structure of the resulting product was analyzed by means of FT-IR (available from NICOLET Corporation). As a result, the product was identified as a cyclic phosphazene compound represented by the following structural formula (a1):

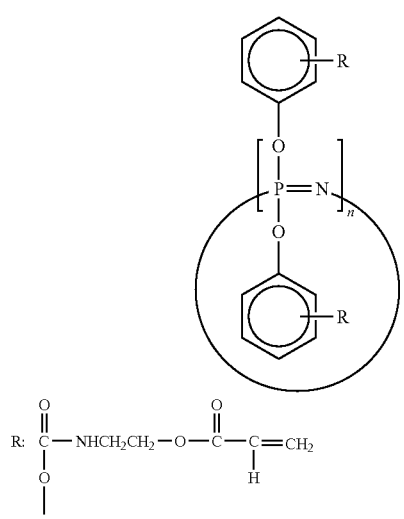

(a1)

wherein n is 2 to 5 (average).

Synthesis of Cyclic Phosphazene Compound a2

First, 0.0050 g of hydroquinone was added to 20.0 g of a cyclic phenoxyphosphazene compound (SPH-100 available from Otsuka Chemical Co., Ltd.) and heated to 90° C. to be dissolved in the cyclic phenoxyphosphazene compound. Then, 15.1 g of 2-methacryloyloxyethyl isocyanate was added to the resulting mixture, and allowed to react with the mixture for ten hours in a stream of nitrogen. After completion of the reaction, a molecular structure of the resulting product was analyzed by means of FT-IR (available from NICOLET Corporation). As a result, the product was identified as a cyclic phosphazene compound represented by the following structural formula (a2):

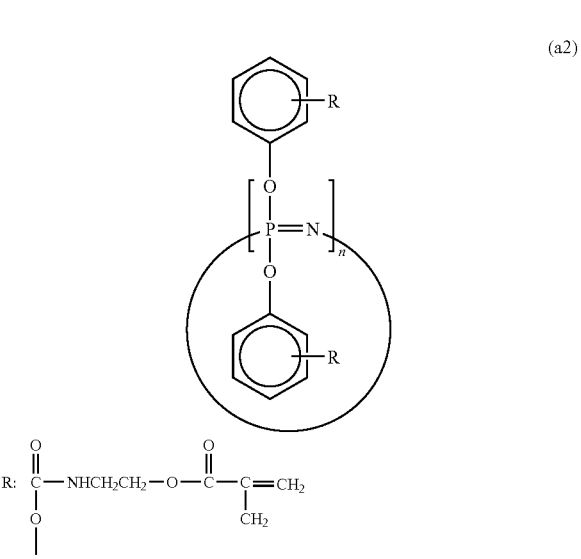

(a2)

wherein n is 2 to 5 (average).

Synthesis of Carboxyl-Containing Linear Polymer

First, 135.1 g of ethylene diglycol acetate was poured as a solvent into a 500-ml separable flask in a nitrogen atmosphere, and heated up to 100° C. with stirring. After the solvent was kept at 100° C. for one hour, a mixture obtained by mixing 144.9 g of phenoxyethyl acrylate, 58.0 g of methacrylic acid and 86.9 g of methyl methacrylate (monomers) with 70.4 g of ethylene diglycol acetate (solvent) and 4.6 g of azobisisobutylonitrile (catalyst) was added dropwise into the separable flask in three hours for reaction.

After the resulting solution was stirred at 100° C. for two hours, the solution was cooled. The solution thus obtained had a solid content of 58.5 wt %. A polymer (carboxyl-containing linear polymer) contained in the solution had structural units represented by the above general formula (3) (wherein the weight ratio of the repeating units x, y, z was x:y:z=20:31:49) and a weight average molecular weight (Mw) of $2.3 \times 10^4$ as measured by GPC (based on styrene calibration standards).

Further, the following components were prepared.

Cyclic Phosphazene Compound a3

A cyclic phosphazene compound represented by the following structural formula (a3) (SPB-100 available from Otsuka Chemical Co., Ltd.):

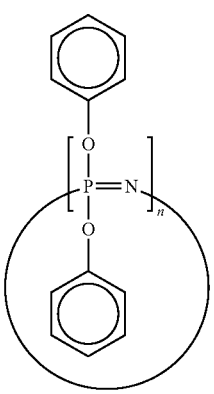

(a3)

wherein n is 2 to 5 (average).

Epoxy Resin

A 60 wt % ethyl diglycol acetate solution of a phosphorus-containing epoxy resin (FX-305 available from Tohto Kasei Co., Ltd. and having a phosphorus content of 3 wt %)

Ethylenically Unsaturated Group-Containing Polymerizable Compound

A bisphenol-A methacrylate modified with ethylene oxide (BIS-A acrylate BPE500 available from Shin-Nakamura Chemical Co., Ltd. and represented by the above formula (5) in which p+q=10)

Photopolymerization Initiator e1

IRGACURE 907 available from Ciba Geigy Corporation

Photopolymerization Initiator e2

KAYACURE DETX-S available from Nippon Kayaku Co., Ltd.

Pigment

Phthalocyanine blue (UTCO-053 available from Dainichiseika Color & Chemicals Mfg. Co., Ltd.)

Tackifier 5-amino-1-H-tetrazole (dissolved in 1.5 g of ethyl diglycol acetate and 1.5 g of N-methyl-2-pyrrolidone for use). In Tables 1 and 2, the amounts of the tackifier are those before the tackifier was dissolved in these solvents.

Defoaming Agent

MODAFLOW (available from CBC materials Co., Ltd.)

Multi-Functional Ethylenically Unsaturated Group-Containing Polymer Compound

Trimethylol propane triacrylate

Examples 1 to 5 and Comparative Examples 1 to 3

Photosensitive resin compositions were prepared by blending and mixing components in proportions shown in Tables 1 and 2.

The photosensitive resin compositions thus prepared were each evaluated for the following properties by the following evaluation methods. The results of the evaluation are shown in Tables 1 and 2.

High Temperature/High Humidity Test

Solutions of the photosensitive resin compositions were each applied on a 35-μm thick copper foil with the use of an applicator and dried at 90° C. for 30 minutes. The resulting coating film had a dry thickness of 20 μm. Then, a 38-μm thick polyethylene terephthalate (PET) film was brought into intimate contact with the coating film, which was in turn irradiated with ultraviolet radiation with a dose of 500 mJ/cm² by a 250 W ultra high pressure mercury lamp. Thereafter, the PET film was removed, and the resulting coating film was developed with a 1 wt % sodium carbonate aqueous solution at 30° C. at 0.2 MPa for 90 seconds. Then, the developed coating film was rinsed with tap water for 30 seconds, and then dried at 150° C. for 30 minutes in a hot air circulation drier. Thus, a test piece was prepared.

The test piece was allowed to stand at 60° C. at 95% RH for 1000 hours. Then, the surface of the coating film of the cured photosensitive resin composition was visually checked, and evaluated based on the following criteria.

Acceptable (◯): No deposition was observed.
Unacceptable (X): Deposition was observed.

Flame Resistance Test

Solutions of the photosensitive resin compositions were each applied onto a 12.5-μm thick polyimide film (APIKAL 12.5NPI available from Kaneka Corporation) with the use of an applicator, and dried at 90° C. for 30 minutes. The resulting coating film had a dry thickness of 20 μm. Then, a 38-μm thick polyethylene film was brought into intimate contact with the coating film, which was in turn irradiated with ultraviolet radiation with a dose of 500 mJ/cm² by a 250 W ultra high pressure mercury lamp. Thereafter, the polyethylene film was removed, and the resulting coating film was developed with a 1 wt % sodium carbonate aqueous solution at 30° C. at 0.2 MPa for 90 seconds. Then, the developed coating film was rinsed with tap water for 30 seconds, and then dried at 150° C. for 30 minutes in a hot air circulation drier. In this manner, 10 test pieces were prepared.

The test pieces were evaluated for flame resistance by a VTM method by means of a device (No. 1031 HVUL UL combustion test chamber available from Toyo Seiki Seisaku-sho Ltd.) in conformity with the Flame Resistance Test Standard UL94. The evaluation was based on the following criteria.

Acceptable (◯): All the test pieces were rated as VTM-0.
Unacceptable (X): At least one of the test piece was burned.

Evaluation of Resolution

Solutions of the photosensitive resin compositions were each applied onto a 35-μm thick copper foil with the use of an applicator, and dried at 90° C. for 30 minutes. The resulting coating film had a dry thickness of 20 μm. Then, a 38-μm thick polyethylene film was brought into intimate contact with the coating film, which was in turn irradiated with ultraviolet radiation with a dose of 500 mJ/cm² by a 250 W ultra high pressure mercury lamp through an exposure mask designed for evaluation of resolution. Thereafter, the polyethylene film was removed, and the resulting coating film was developed with a 1 wt % sodium carbonate aqueous solution at 30° C. at 0.2 MPa for 90 seconds. Then, the developed coating film was rinsed with tap water for 30 seconds. The exposure mask had 100 round via-patterns each having a diameter of 200 μm, 100 round via-patterns each having a diameter of 150 μm and 100 round via-patterns each having a diameter of 100 μm for formation of via-holes, and the resulting via-holes were checked for the evaluation of the resolution based on the following criteria.

Acceptable (◯): All the via-holes were properly open.
Unacceptable (X): Some of the via-holes were closed.

Warp Resistance

As in the flame resistance test, solutions of the photosensitive resin compositions were each applied onto a 25-μm thick polyimide film (25NPI available from Kaneka Corporation), and dried at 90° C. for 30 minutes. The resulting coating film had a dry thickness of 20 μm. Then, the coating film was cut into a 10 cm square test piece, and the warp height of the test piece was measured. A test piece having a warp height of not less than 20 mm or curled in a roll shape was rated as unacceptable (X), and a test piece having a warp height of less than 20 mm was rated as acceptable (◯).

TABLE 1

| | | | | | | (Part by weight) | |
| | | | | Example | | | |
| | | | 1 | 2 | 3 | 4 | 5 |
| (A) | Cyclic phosphazene compound | a1 | 4.2 | 8.5 | 11.5 | — | — |
| | | a2 | — | — | — | 8.5 | 4.2 |
| | | a3 | 4.3 | — | — | — | 4.3 |

TABLE 1-continued

|     |     |     | (Part by weight) Example | | | | |
| --- | --- | --- | --- | --- | --- | --- | --- |
|     |     |     | 1 | 2 | 3 | 4 | 5 |
| (B) | Carboxyl-containing linear polymer | | 30.0 | 30.0 | 30.0 | 30.0 | 30.0 |
| (C) | Epoxy resin | | 13.1 | 13.1 | 13.1 | 13.1 | 13.1 |
| (D) | Ethylenically unsaturated group-containing polymerizable compound | | 6.8 | 6.8 | 6.8 | 6.8 | 6.8 |
|     | Multi-functional ethylenically unsaturated group-containing polymer compound | | 0.98 | 0.98 | 0.98 | 0.98 | 0.98 |
| (E) | Photopolymerization inhibitor | e1 | 1.3 | 1.3 | 1.3 | 1.3 | 1.3 |
|     |     | e2 | 1.3 | 1.3 | 1.3 | 1.3 | 1.3 |
|     | Pigment | | 0.65 | 0.65 | 0.65 | 0.65 | 0.65 |
|     | Tackifier | | 0.13 | 0.13 | 0.13 | 0.13 | 0.13 |
|     | Defoaming agent | | 0.49 | 0.49 | 0.49 | 0.49 | 0.49 |
| Amount of cyclic phosphazene compound in photosensitive resin composition (wt %) | | | 19.0 | 19.0 | 24.0 | 19.0 | 19.0 |
| Amount of cyclic phosphazene compound represented by formula (1) in photosensitive resin composition (wt %) | | | 10.0 | 19.0 | 24.0 | 19.0 | 10.0 |
| High temperature/high humidity test | | | ○ | ○ | ○ | ○ | ○ |
| Flame resistance | | | ○ | ○ | ○ | ○ | ○ |
| Resolution | | | ○ | ○ | ○ | ○ | ○ |
| Warp resistance | | | ○ | ○ | ○ | ○ | ○ |

TABLE 2

|     |     |     | (Part by weight) Comparative Example | | |
| --- | --- | --- | --- | --- | --- |
|     |     |     | 1 | 2 | 3 |
| (A) | Cyclic phosphazene compound | a1 | 1.3 | 18.0 | — |
|     |     | a2 | — | — | — |
|     |     | a3 | — | — | 8.5 |
| (B) | Carboxyl-containing linear polymer | | 30.0 | 30.0 | 30.0 |
| (C) | Epoxy resin | | 13.1 | 13.1 | 13.1 |
| (D) | Ethylenically unsaturated group-containing polymerizable compound | | 6.8 | 6.8 | 6.8 |
|     | Multi-functional ethylenically unsaturated group-containing polymer compound | | 0.98 | 0.98 | 0.98 |
| (E) | Photopolymerization inhibitor | e1 | 1.3 | 1.3 | 1.3 |
|     |     | e2 | 1.3 | 1.3 | 1.3 |
|     | Pigment | | 0.66 | 0.65 | 0.65 |
|     | Tackifier | | 0.1246 | 0.1246 | 0.1246 |
|     | Defoaming agent | | 0.49 | 0.49 | 0.49 |
| Amount of cyclic phosphazene compound in photosensitive resin composition (wt %) | | | 3.4 | 32.0 | 19.0 |
| Amount of cyclic phosphazene compound represented by formula (1) in photosensitive resin composition (wt %) | | | 3.4 | 32.0 | 0 |
| High temperature/high humidity test | | | X | ○ | X |
| Flame resistance | | | X | ○ | ○ |
| Resolution | | | ○ | X | ○ |
| Warp resistance | | | ○ | X | ○ |

The above results indicate that the photosensitive resin compositions of Examples 1 to 5 were excellent in flame resistance, resolution and warp resistance. In the high temperature/high humidity test, the photosensitive resin compositions of Examples 1 to 5 were free from the deposition on the surfaces of the coating films, providing excellent results.

On the other hand, the photosensitive resin composition of Comparative Example 1 which contained the specific cyclic phosphazene compound in a proportion less than the specific range was acceptable in resolution and warp resistance, but was poorer in flame resistance. Further, the photosensitive resin composition of Comparative Example 1 suffered from the deposition in the high temperature/high humidity test. The photosensitive resin composition of Comparative Example 2 which contained the specific cyclic phosphazene compound in a proportion greater than the specific range was excellent in flame resistance and high temperature/high humidity test result, but was poorer in resolution and warp resistance. The photosensitive resin composition of Comparative Example 3 which contained the prior-art ordinary cyclic phosphazene compound was excellent in flame resistance, resolution and warp resistance, but suffered from the deposition in the high temperature/high humidity test.

Next, flexible printed wiring circuit boards were produced by the method described above as having insulative cover layers formed by using the photosensitive resin compositions of Examples 1 to 5 as insulative cover layer materials. It was possible to form the insulative cover layers with higher resolution with the use of a mask film. The flexible printed wiring circuit boards were satisfactory in flexibility and flame resistance, and free from the deposition under the high temperature and high humidity conditions.

Although specific forms of embodiments of the instant invention have been described above in order to be more clearly understood, the above description is made by way of example and not as a limitation to the scope of the instant invention. It is contemplated that various modifications apparent to one of ordinary skill in the art could be made without departing from the scope of the invention which is to be determined by the following claims.

What is claimed is:

1. A photosensitive resin composition comprising:
    (A) a cyclic phosphazene compound represented by the following general formula (1):

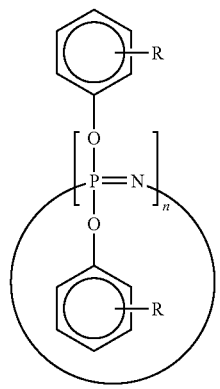
(1)

wherein each R may be the same or different and each R is a hydrogen atom, a hydroxyl group or an organic group having a urethane(meth)acrylate structure represented by the following general formula (2), at least one of the Rs being the organic group having the urethane(meth)acrylate structure, and n is a positive number of 2 to 5, representing an average polymerization degree:

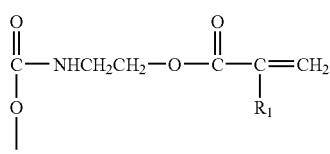
(2)

wherein $R_1$ is a hydrogen atom or a methyl group;

(B) a carboxyl-containing linear polymer obtained by polymerizing an ethylenically unsaturated compound through addition polymerization;

(C) an epoxy resin;

(D) an ethylenically unsaturated group-containing polymerizable compound; and (E) a photopolymerization initiator;

wherein the cyclic phosphazene compound (A) is present in a proportion of 5 to 30 wt % based on a total weight of the composition.

2. A photosensitive resin composition as set forth in claim 1, wherein the epoxy resin (C) is an epoxy resin having a phenyl phosphate skeleton represented by the following general formula (4):

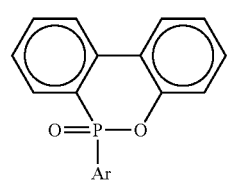
(4)

wherein Ar is an aromatic group.

3. A photosensitive resin composition as set forth in claim 1, wherein the ethylenically unsaturated group-containing polymerizable compound (D) comprises a bisphenol-A di(meth)acrylate compound represented by the following general formula (5):

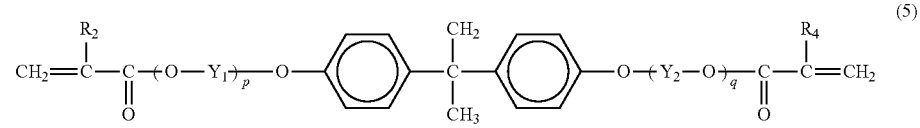
(5)

wherein $R_3$ and $R_4$, which may be the same or different, are each a hydrogen atom or a methyl group, $Y_1$ and $Y_2$ are each a $C_2$ to $C_6$ alkylene group, and p and q are positive integers, which satisfy a relationship of p+q=4 to 40.

4. A photosensitive resin composition as set forth in claim 1, wherein the carboxyl-containing linear polymer (B) contains structural units represented by the following general formula (3):

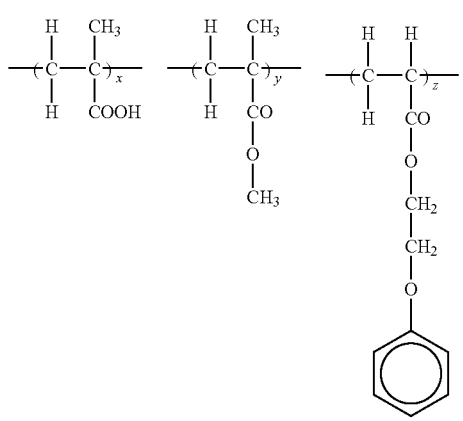

(3)

wherein x is a positive number, and y and z are 0 or positive numbers.

5. A photosensitive resin composition as set forth in claim 1, wherein the carboxyl-containing linear polymer (B) is present in a proportion of 20 to 60 wt % based on the total weight of the composition.

6. A flexible printed wiring circuit board having an electrically conductive circuit pattern covered with an insulative cover layer formed by forming a layer of a photosensitive resin composition as recited in claim 1, and exposing and developing the photosensitive resin composition layer into a predetermined pattern.

* * * * *